(12) United States Patent
Sun et al.

(10) Patent No.: US 9,040,401 B1
(45) Date of Patent: May 26, 2015

(54) METHOD FOR FORMING PATTERNED DOPING REGIONS

(71) Applicant: Industrial Technology Research Institute, Hsinchu (TW)

(72) Inventors: Wen-Ching Sun, Pingzhen (TW); Sheng-Min Yu, Pingzhen (TW); Tai-Jui Wang, Kaohsiung (TW); Tzer-Shen Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/626,675

(22) Filed: Feb. 19, 2015

Related U.S. Application Data

(62) Division of application No. 13/710,795, filed on Dec. 11, 2012.

(30) Foreign Application Priority Data

Sep. 26, 2012 (TW) .............................. 101135229 A

(51) Int. Cl.
*H01L 21/22* (2006.01)
*H01L 21/38* (2006.01)
*H01L 21/225* (2006.01)
*H01L 31/18* (2006.01)

(52) U.S. Cl.
CPC .............. *H01L 21/225* (2013.01); *H01L 31/18* (2013.01)

(58) Field of Classification Search
CPC ................... H01L 31/022425; H01L 31/0216; H01L 31/02167; H01L 21/0455; H01L 21/046; H01L 21/22; H01L 21/223; H01L 21/225; H01L 21/228; H01L 21/38; H01L 21/383; H01L 21/385; H01L 21/388; H01L 21/265; H01L 21/2652; H01L 21/2254; H01L 21/2255
See application file for complete search history.

(56) References Cited

U.S. PATENT DOCUMENTS

| 3,730,787 A | 5/1973 | Murphy et al. |
| 3,808,060 A | 4/1974 | Hays et al. |
| 4,003,770 A | 1/1977 | Janowiecki et al. |
| 4,006,046 A | 2/1977 | Parekh |
| 4,102,715 A | 7/1978 | Kambara et al. |

(Continued)

FOREIGN PATENT DOCUMENTS

FR     2154479 A1    5/1973

OTHER PUBLICATIONS

D.S. Kim et al., "Development of a Phosphorus Spray Diffusion System for Low-cost Silicon Solar Cells", Journal of The Electrochemical Society, 2006, vol. 153, Issue 7, pp. A1391-A1396.

(Continued)

*Primary Examiner* — Thanh Y Tran
(74) *Attorney, Agent, or Firm* — Muncy, Geissler, Olds & Lowe, P.C.

(57) ABSTRACT

A method for forming doping regions is disclosed, including providing a substrate, forming a first-type doping material on the substrate and forming a second-type doping material on the substrate, wherein the first-type doping material is separated from the second-type doping material by a gap; forming a covering layer to cover the substrate, the first-type doping material and the second-type doping material; and performing a thermal diffusion process to diffuse the first-type doping material and the second-type doping material into the substrate.

5 Claims, 5 Drawing Sheets

(56) References Cited

U.S. PATENT DOCUMENTS

| | | | |
|---|---|---|---|
| 4,320,251 | A | 3/1982 | Narasimhan et al. |
| 4,394,674 | A | 7/1983 | Sakuma et al. |
| 4,478,879 | A | 10/1984 | Baraona et al. |
| 5,527,389 | A | 6/1996 | Rosenblum et al. |
| 5,543,356 | A | 8/1996 | Murakami et al. |
| 6,274,402 | B1 | 8/2001 | Verlinden et al. |
| 7,339,110 | B1 | 3/2008 | Mulligan et al. |
| 7,351,637 | B2 * | 4/2008 | Tucker .................... 438/289 |
| 7,388,147 | B2 | 6/2008 | Mulligan et al. |
| 7,615,393 | B1 | 11/2009 | Shah et al. |
| 7,700,400 | B2 | 4/2010 | Onishi et al. |
| 7,820,475 | B2 | 10/2010 | De Ceuster et al. |
| 7,846,823 | B2 | 12/2010 | Funakoshi |
| 7,883,343 | B1 | 2/2011 | Mulligan et al. |
| 7,897,867 | B1 | 3/2011 | Mulligan et al. |
| 7,923,368 | B2 | 4/2011 | Terry et al. |
| 7,951,637 | B2 | 5/2011 | Weidman et al. |
| 8,053,343 | B2 | 11/2011 | Huh et al. |
| 2005/0233558 | A1 | 10/2005 | Yamamoto et al. |
| 2007/0278534 | A1 | 12/2007 | Bui et al. |
| 2010/0159681 | A1 * | 6/2010 | Tsumura .................. 438/527 |
| 2010/0230604 | A1 | 9/2010 | Bui et al. |
| 2010/0258524 | A1 | 10/2010 | Remiat et al. |
| 2011/0139226 | A1 | 6/2011 | Ha |
| 2011/0298100 | A1 * | 12/2011 | Nakamura ................ 257/655 |
| 2012/0021557 | A1 | 1/2012 | Kim et al. |
| 2012/0252197 | A1 * | 10/2012 | Clark ....................... 438/559 |

OTHER PUBLICATIONS

Jiun-Hua Guo et al., "Laser-Grooved Backside Contact Solar Cells With 680-mV Open-Circuit Voltage", IEEE Transactions on Electron Devices, vol. 51, No. 12, Dec. 2004.

Peter Hacke et al., "A screen-printed interdigitated back contact cell using a boron-source diffusion barrier", Solar Energy Materials & Solar Cells, 2005, 88, pp. 119-127.

Nicholas Bateman et al., "High quality ion implanted boron emitters in an interdigitated back contact solar cell with 20% efficiency", Energy Procedia, 2011, pp. 509-514.

Peter J. Cousins et al., "Generation 3: Improved Performance at Low Cost", Sunpower Corporation, 3939 North First St, San Jose 95134, California, USA, 2010 IEEE pp. 275-278.

Robert Bock et al., "Back-junction back-contact n-type silicon solar cells with screen-printed aluminum-alloyed emitter", Applied Physics Letters 96, pp. 263507-1 to 263507-3, Jun. 28, 2010.

A. Das et al., "Boron Diffusion with Boric Acid for High Efficiency Silicon Solar Cells", Journal of The electrochemical Society, 2010, vol. 157, Issue 6, pp. H684-H687.

R. Woehl et al., "19.7 Efficient All-Screen-Printed Back-Contact Back-Junction Silicon Solar Cell With Aluminum-Alloyed Emitter", IEEE Electron Device Letters, vol. 32, No. 3, Mar. 2011, pp. 345-347.

Official Action issued on Dec. 3, 2013, by the European Patent Office in corresponding Application No. 13162155.9.

Official Action issued on Feb. 21, 2014, by the European Patent Office in corresponding Application No. 13162155.9.

* cited by examiner

METHOD FOR FORMING PATTERNED DOPING REGIONS

CROSS-REFERENCE TO RELATED APPLICATION

This application is a divisional of U.S. application Ser. No. 13/710,795, filed on Dec. 11, 2012, which claims priority of Taiwan Patent Application No. 101135229, filed on Sep. 26, 2012, the entireties of which are incorporated by reference herein.

BACKGROUND

1. Technical Field

The technical field relates to a method for forming patterned doping regions, and more particularly to a method for forming patterned doping regions of a solar cell.

2. Description of the Related Art

In recent years, due to rise of environmental protection and global warming, the green industry has been greatly developed. Solar cells are a major technology in the green industry. Methods for developing a high efficiency, low-cost solar cell have become an important focus of research. Solar cells can be disposed on buildings, such as houses, and movable apparatus, such as cars; indoors, or on portable electric devices, to convert light into electrical power.

The conventional art develops solar cells with selective emitters. Emitters with a low concentration between electrodes can reduce the recombination of carriers at the surface of the cell, while emitters with a higher doping concentration under electrodes can provide good contact. Therefore, compared to conventional solar cells with emitting structures that have a constant doping concentration, solar cells with selective emitters have higher open loop voltage (Voc) and short-circuit current (Isc) and thus higher photoelectric conversion efficiency.

In 2010, Sunpower Company developed a solar cell with a back electrode having a cross-finger shape and an efficiency of 24.2%. Although this solar cell has a good conversion efficiency, it has a very high manufacturing cost due to its requiring many high-temperature and photolithography processes.

Both the solar cells with selective emitters and the solar cells with a back electrode having a cross-finger shape employ patterned doping regions to increase conversion efficiency. However, the process for forming patterned doping regions is more complicated and requires a highly accurate process, such as lithography, thus increasing the cost of the solar cell.

SUMMARY

The present disclosure provides a method for forming doping regions, comprising providing a substrate, forming a first-type doping material on the substrate, forming a second-type doping material on the substrate, wherein the first-type doping material is separated from the second-type doping material by a gap, forming a covering layer to cover the substrate, the first-type doping material, and the second-type doping material, and performing a thermal diffusion process to diffuse the first-type doping material and the second-type doping material into the substrate.

Another embodiment of the disclosure provides a method for forming doping regions, comprising providing a substrate, forming a doping material on the substrate, forming at least one patterned covering layer on a portion of a surface of the doping material, wherein the portion of the doping material is covered by at least one patterned covering layer, and another portion of the doping material not covered by the patterned covering layer is exposed, and performing a thermal diffusion process to diffuse the doping material into the substrate, forming a first doping region in a portion of the substrate underlying the patterned covering layer and forming a second doping region in a portion of the substrate not covered by the patterned covering layer, wherein the doping concentration of the first doping region is greater than the doping concentration of the second doping region.

BRIEF DESCRIPTION OF DRAWINGS

The disclosure can be more fully understood by reading the subsequent detailed description and examples with references made to the accompanying drawings, wherein.

DETAILED DESCRIPTION

Figure 1A:
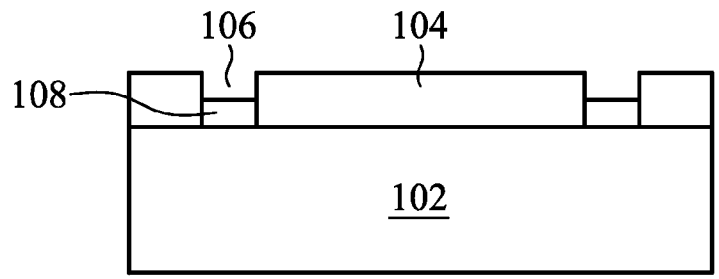
FIG. 1A~FIG. 1G show cross sections of intermediate stages of a method for forming a structure comprising p-type regions and n-type regions.
Figure 1B:
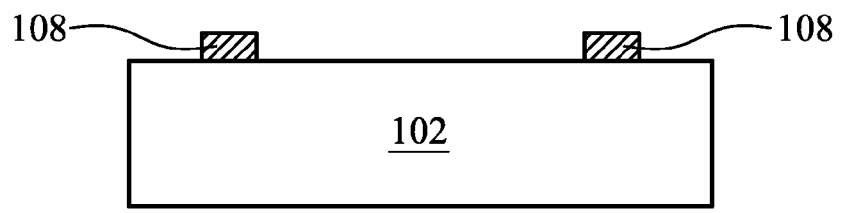

In the following detailed description, for purposes of explanation, numerous specific details are set forth in order to provide a through understanding of the disclosed embodiments. It will be apparent, however, that one or more embodiments may be practiced without these specific details. In other instances, well-known structures and devices are schematically shown in order to simplify the drawing.

An embodiment of the disclosure forms p-type or n-type patterned doping regions using a coating of phosphoric acid or boric acid. The embodiment uses screen printing to take off photolithography and further uses a coating layer to avoid the spread of coated phosphoric acid or boric acid. An embodiment of the disclosure can use a single thermal diffusing step to get a p-type pattern region or an n-type pattern region.

A method for forming a structure comprising p-type regions and n-type regions is illustrated FIG. 1A~FIG. 1G. In an embodiment of the disclosure, the p-type and n-type pattern doping regions are used to form the cross-finger back electrodes of a solar cell. First, referring to FIG. 1A, a substrate 102 is provided. The substrate 102 may comprise silicon, gallium arsenide, gallium nitride, strained silicon, silicon germanium, silicon carbide, diamond, an epitaxy layer, and/or other materials. Next, a first mask 104 comprising first openings 106 is provided overlying the substrate 102. In an embodiment of the disclosure, the first mask 104 can be a screen. Thereafter, a first-type doping material 108 is formed into the first openings 106 in the first mask 104. The method for forming the first-type doping material 108 can be spray coating, spin coating, or screen printing. In an embodiment in which the first-type doping material 108 is p-type doping material, the first-type doping material 108 can be a boride, aluminide or gallide. Furthermore, the first-type doping material 108 can be boron glass, and can be formed by the following steps. Boric acid is coated on the first mask 104, such as a screen, and is filled into the first opening 106. Next, a thermal process is performed to convert the liquid-state boric acid to a colloidal-state or a solid-state compound, such as a colloidal-state or a solid-state boride. The thermal process can have a temperature of 200° C.~600° C. and can further have a temperature of 250° C.~350° C. In an embodiment in which the first-type doping material 108 is n-type doping material, the first-type doping material 108 can be a phosphide, arsenide or telluride. Furthermore, the first-type doping material 108 can be phosphorous glass, and can be formed by the following steps. Phosphorous acid is coated on the first mask 104, such as a screen, and is filled into the first opening 106. Next, a thermal process is performed to convert the liquid-state phosphoric acid to a colloidal-state or a solid-state compound, such as a colloidal-state or a solid-state phosphide. The thermal process can have a temperature of 200° C.~600° C. and can further have a temperature of 250° C.~350° C.

Figure 1C:
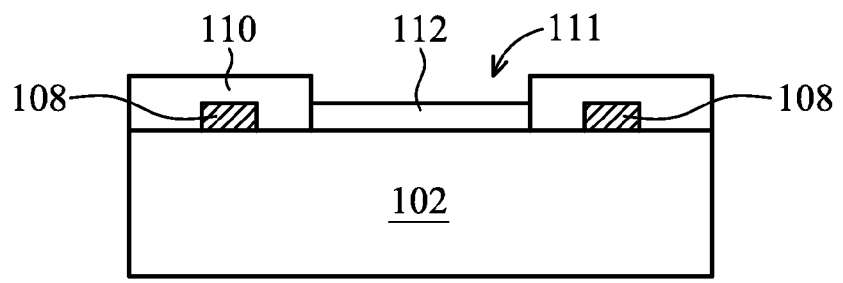

Referring to FIG. 1C, a second mask layer 110 comprising second openings 111 is formed overlying the substrate 102, wherein the second mask 110 can be a screen. Thereafter, a second-type doping material 112 is formed into the second opening 111 in the second mask 110, wherein the method for forming the second-type doping material 112 can be spray coating, spin coating or screen printing. In an embodiment of the disclosure, the first-type doping material 108 can be p-type doping material, and the second-type doping material 112 can be n-type doping material. In another embodiment of the disclosure, the first-type doping material 108 can be n-type doping material, and the second-type doping material 112 can be p-type doping material.

In an embodiment in which the second-type doping material 112 is n-type doping material, the second-type doping material 112 can be a phosphide, arsenide or telluride. Furthermore, the second-type doping material 112 can be phosphorous glass, and can be formed by the following steps. Phosphorous acid is coated on the second mask 110, such as a screen, and is filled into the second opening 111. Next, a thermal process is performed to convert the liquid-state phosphoric acid to a colloidal-state or a solid-state compound, such as a colloidal-state or a solid-state phosphide. The thermal process can have a temperature of 200° C.~600° C. and can further have a temperature of 250° C.~350° C. In an embodiment in which the second-type doping material 112 is p-type doping material, the second-type doping material 112 can be a boride, aluminide or gallide. Furthermore, the second-type doping material 112 can be boron glass, and can be formed by the following steps. Boric acid is coated on the second mask 110, such as a screen, and is filled into the second opening 111. Next, a thermal process is performed to convert the liquid-state boric acid to a colloidal-state or a solid-state compound, such as a colloidal-state or a solid-state boride. The thermal process can have a temperature of 200° C.~600° C. and can further have a temperature of 250° C.~350° C.

Figure 1D:
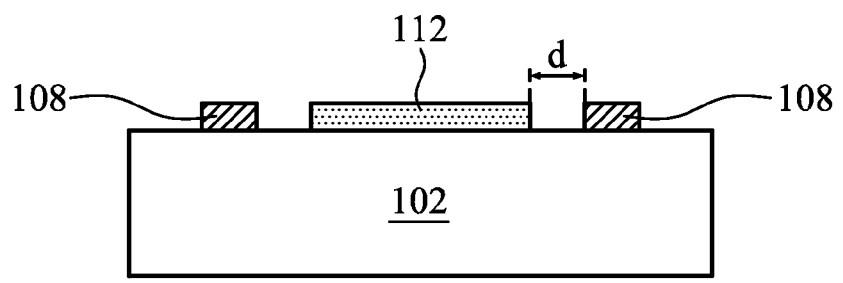

Next, referring to FIG. 1D, the second mask 110 is removed. In an embodiment of the disclosure, the first-type doping material 108 and the second-type doping material 112 are separated by a distance d, and the distance d can be 5 µm~30 µm.

Figure 1E:
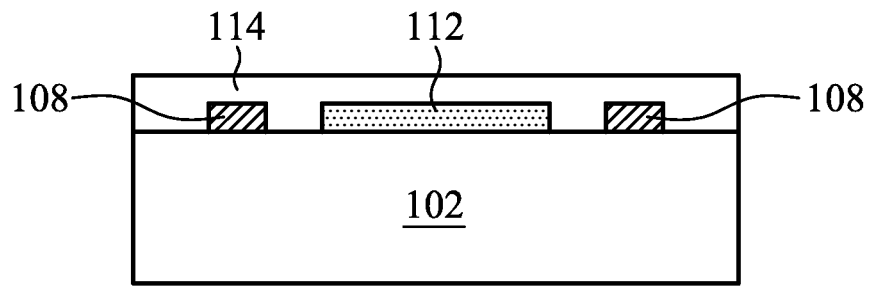

Referring to FIG. 1E, a covering layer 114 is formed on the substrate 102, the first-type doping material 108, and the second-type doping material 112. The method for forming the covering layer 114 can be spray coating, spin coating, screen printing, plasma enhanced chemical vapor deposition (PECVD), or atomic layer deposition (ALD). In an embodiment of the disclosure, the covering layer 114 can be $SiN_x$ or $Al_2O_3$. $Al_2O_3$ is a preferable material for the covering layer 114 since $Al_2O_3$ does not substantially react with boron doping material or phosphorous doping material, and $Al_2O_3$ is stable at high temperatures and is easily removed. Furthermore, $Al_2O_3$ does not substantially affect the diffusion of boron doping material and phosphorous doping material into the substrate. Compared to silicon oxide, using $Al_2O_3$ as the covering layer in the embodiment can avoid affecting the diffusion of boron or phosphorous.

Figure 1F:
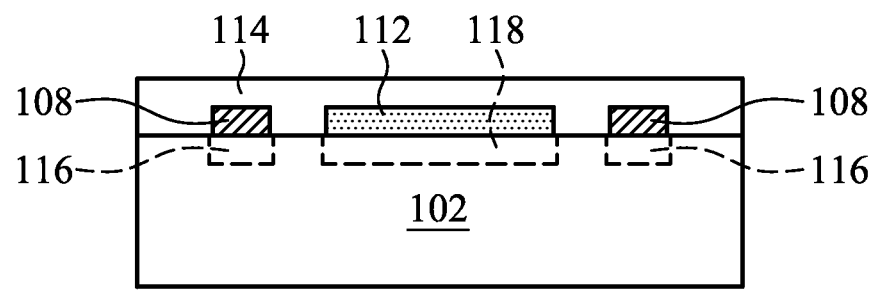
Figure 1G:
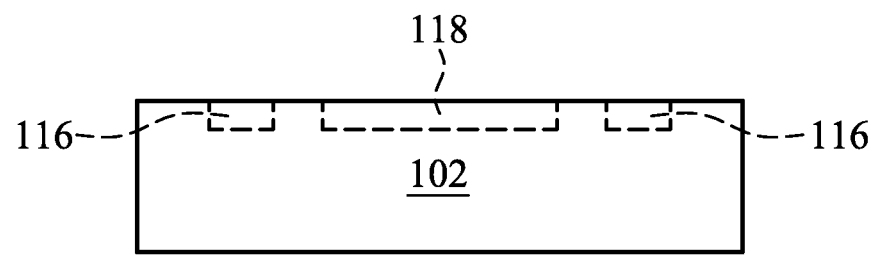

Next, referring to FIG. 1F, a thermal diffusion process is performed to diffuse the first-type doping material 108 into the substrate 102 to form a first doping region 116, and diffuse the second-type doping material 112 into the substrate 102 to form a second doping region 118. In an embodiment of the disclosure, the temperature of the thermal diffusion process can be 800° C. to 1000° C., and further can be 700° C. to 1200° C. It is noted that since the first-type doping material 108, the second-type doping material 112, and the substrate 102 are covered by the covering layer 114 in the embodiment, the lateral diffusion of the first-type doping material 108 and the second-type doping material 112 is limited. Therefore, the first-type doping material 108 and the second-type doping material 112 substantially diffuse downward to increase the accuracy of the first doping region 116 and the second doping region 118. Thereafter, referring to FIG. 1G, the covering layer 114, the first-type doping material 108 and the second-type doping material 112 are removed. In an embodiment of the disclosure, removing the covering layer 114, the first-type doping material 108 and the second-type doping material 112 can be accomplished by immersion in a fluorine-containing solution.

A method for forming a structure comprising p-type or n-type patterned doping regions is illustrated FIG. 2A~FIG. 2D. In an embodiment of the disclosure, the p-type regions or n-type patterned doping regions are used to form selective emitters of a solar cell. First, referring to FIG. 2A, a substrate 202 is provided. The substrate 202 may comprise silicon, gallium arsenide, gallium nitride, strained silicon, silicon germanium, silicon carbide, diamond, an epitaxy layer, and/or other materials. Next, a doping material 204 is formed on the substrate 202. In an embodiment in which the doping material 204 is p-type doping material, the doping material can be a boride, aluminide or gallide. Furthermore, the doping material 204 can be boron glass, and can be formed by the following steps. Boric acid is coated on the substrate. Next, a thermal process is performed to convert the liquid-state boric acid to a solid-state compound, such as a solid-state boride. In an embodiment in which the doping material 304 is n-type doping material, the doping material can be a phosphide, arsenide or telluride. Furthermore, the doping material can be phosphorous glass, and can be formed by the following steps: Phosphorous acid is coated on the substrate, and next a thermal process is performed to convert the liquid-state phosphoric acid to a solid-state compound, such as a solid state phosphide. Thereafter, referring to FIG. 2B, a patterned covering layer 206 is formed on the doping material 204, wherein the patterned covering layer 206 can be formed by screen printing, and can be $SiN_x$ or $Al_2O_3$. $Al_2O_3$ is a preferable material for the patterned covering layer 206 since $Al_2O_3$ does not react substantially with the doping material 204, and does not substantially affect the diffusion of the doping material 204.

Figure 2A:
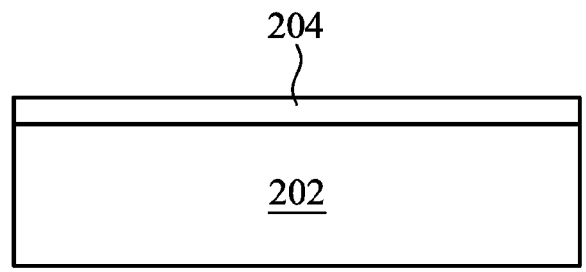
FIG. 2A~FIG. 2D show cross sections of intermediate stages of a method for forming a structure comprising p-type or n-type patterned doping regions.
Figure 2B:
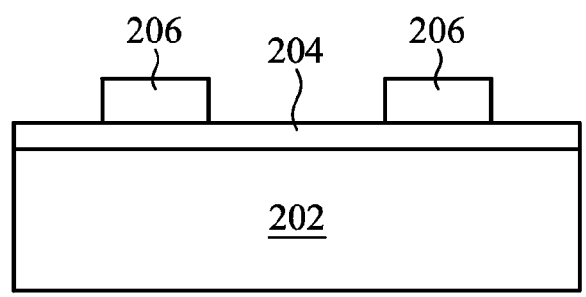
Figure 2C:
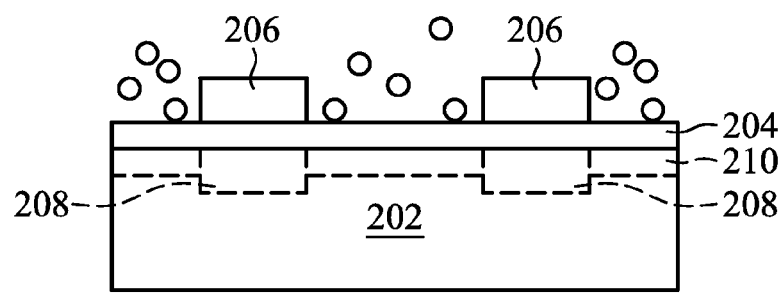
Figure 2D:
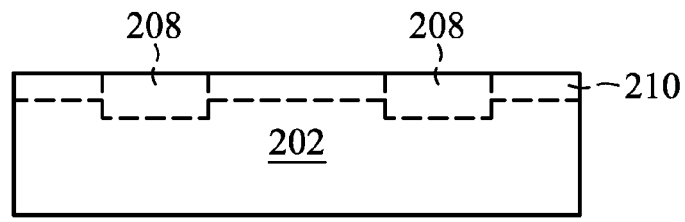

Thereafter, referring to FIG. 2C, a thermal process is performed to diffuse the doping material 204 into the substrate 202, forming a first doping region 208 in a portion of the substrate 202 under the patterned covering layer 206 and forming a second doping region 210 in a portion of the substrate 202 uncovered by the patterned covering layer 206. It is noted that since the doping material 204 under the patterned covering layer 206 is covered, the doping material 204 does not evaporate to diffuse upward, thus the major portion of the doping material 204 covered by the patterned covering layer 206 diffuse downward, but the doping material 204 not covered by the patterned covering layer 206 can evaporate to diffuse upward. Therefore, the first doping region 208 under the patterned covering layer 206 has a higher doping concentration and lower resistance than the second doping region 210 uncovered by the patterned covering layer 206. Therefore, the embodiment can form the first doping region 208 and the second doping region 210 with different doping concentrations and resistance using a single thermal diffusion process. Next, referring to FIG. 2D, the doping material 204 is removed. In an embodiment of the disclosure, the doping material 204 can be removed by doping a solution containing fluorine.

Figure 3A:
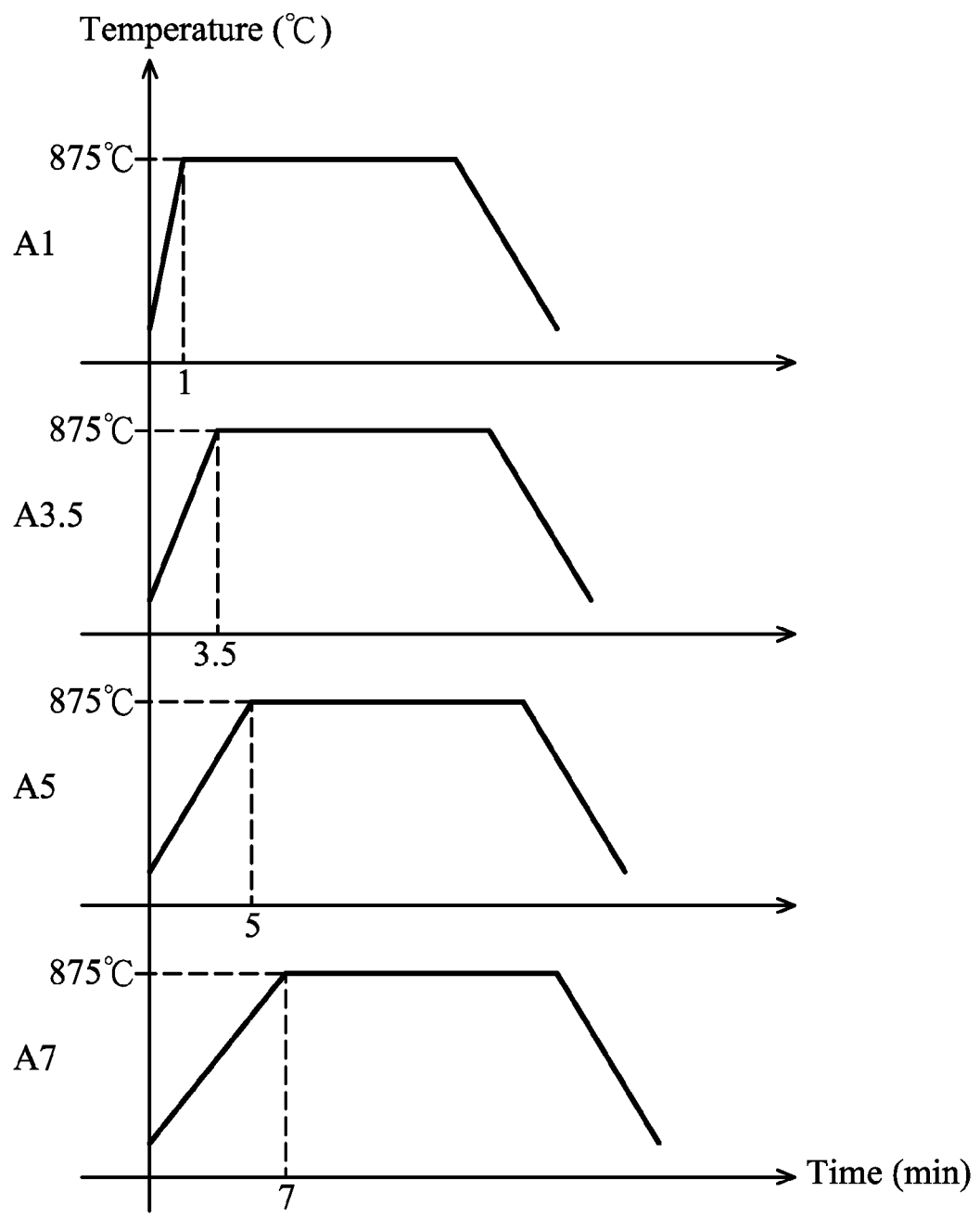
FIG. 3A shows curves with time as a function of temperature for various examples of the disclosure.
Figure 3B:
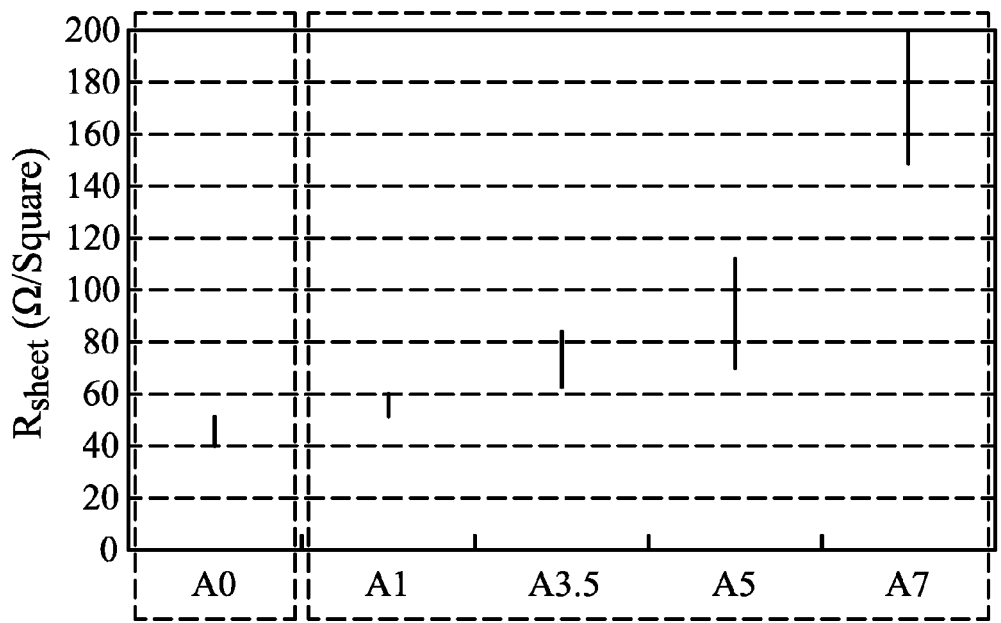
FIG. 3B shows resistance for examples under various heating conditions.

Accordingly, with the formation of the patterned covering layer 206 on the doping material 204, the embodiment can form the first doping region 208 and the second doping region 210 with a different doping concentration using a single thermal diffusion process. The relations between condition of thermal diffusion and resistance of the first doping region 208 and the second doping region 210 are illustrated in accordance with FIG. 3A and FIG. 3B. FIG. 3A shows curves with time as a function of temperature for various examples of the disclosure. FIG. 3B shows resistance of the examples under various heating conditions. In FIG. 3A and FIG. 3B, A0 corresponds to resistance of the first doping region covered with a patterned covering layer. A1 corresponds to resistance of the second doping region uncovered with a patterned covering layer and with a heating condition to raise the temperature to 875° C. in one minute. A3.5 corresponds to resistance of the second doping region uncovered with a patterned covering layer and with a heating condition to raise the temperature to 875° C. in 3.5 minutes. A5 corresponds to resistance of the second doping region uncovered with a patterned covering layer and with a heating condition to raise the temperature to 875° C. in 5 minutes. A7 corresponds to resistance of the second doping region uncovered with a patterned covering layer and with a heating condition to raise the temperature to 875° C. in 7 minutes. According to FIGS. 3A and 3B, the second doping region covered with a patterned covering layer has the lowest resistance, and the condition has a longer rising time to 875° C., presenting a higher resistance. According to the results from FIG. 3A and FIG. 3B, the embodiment can fine tune the duration to the rise in temperature to a degree, such as 875° C., for the first doping region and the second doping region to achieve a predetermined resistance. In addition, the disclosure can further adjust the thickness and concentration of the doping material to tune the concentration of the first doping region and the second doping region.

While the disclosure has been described by way of example and in terms of the embodiments, it is to be understood that the disclosure is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming doping regions, comprising:
   providing a substrate;
   forming a doping material on the substrate;
   forming at least one patterned covering layer on a portion of the surface of the doping material, wherein the portion of the doping material is covered by the at least one patterned covering layer, and another portion of the doping material not covered by the at least one patterned covering layer is exposed; and
   performing a thermal diffusion process to diffuse the doping material into the substrate, forming a first doping region in a portion of the substrate underlying the at least one patterned covering layer and forming a second doping region in a portion of the substrate not covered by the at least one patterned covering layer, wherein the doping concentration of the first doping region is greater than the doping concentration of the second doping region.

2. The method for forming doping regions as claimed in claim 1, wherein the at least one patterned covering layer is $SiN_x$ or $Al_2O_3$.

3. The method for forming doping regions as claimed in claim 1, wherein the doping material is a boride, aluminide, gallide, phosphide, arsenide, or telluride.

4. The method for forming doping regions as claimed in claim 3, wherein the step of forming the doping material on the substrate comprises:
   coating a doping material on a substrate; and
   performing a thermal process for the doping material to convert to a solid-state compound.

5. The method for forming doping regions as claimed in claim 1, wherein the step of forming the at least one patterned covering layer comprises screen printing or spray coating.

* * * * *